United States Patent
Criss

(10) Patent No.: US 11,601,137 B2
(45) Date of Patent: Mar. 7, 2023

(54) ECC MEMORY CHIP ENCODER AND DECODER

(71) Applicant: Intel Corporation, Santa Clara, CA (US)

(72) Inventor: Kjersten E. Criss, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/905,384

(22) Filed: Jun. 18, 2020

(65) Prior Publication Data

US 2020/0321979 A1     Oct. 8, 2020

(51) Int. Cl.
| | |
|---|---|
| *H03M 13/11* | (2006.01) |
| *H03M 13/00* | (2006.01) |
| *H03M 13/19* | (2006.01) |
| *H03M 13/29* | (2006.01) |

(52) U.S. Cl.
CPC ....... *H03M 13/1105* (2013.01); *H03M 13/19* (2013.01); *H03M 13/2942* (2013.01); *H03M 13/617* (2013.01); *H03M 13/00* (2013.01); *H03M 13/11* (2013.01); *H03M 13/29* (2013.01)

(58) Field of Classification Search
CPC .. H03M 13/115; H03M 13/617; H03M 13/19; H03M 12/2942; H03M 13/11; H03M 13/29; H03M 13/00
See application file for complete search history.

(56) References Cited

U.S. PATENT DOCUMENTS

| | | | | |
|---|---|---|---|---|
| 6,615,387 | B1* | 9/2003 | Williamson | H03M 13/151 |
| | | | | 714/784 |
| 6,631,485 | B1* | 10/2003 | Morley | G11B 20/1809 |
| 6,973,613 | B2* | 12/2005 | Cypher | G06F 11/1008 |
| | | | | 714/773 |
| 6,976,194 | B2* | 12/2005 | Cypher | G11C 29/42 |
| | | | | 714/6.2 |
| 6,996,766 | B2* | 2/2006 | Cypher | G06F 11/1048 |
| | | | | 714/6.2 |
| 9,817,714 | B2 | 11/2017 | Halbert et al. | |
| 9,912,355 | B2* | 3/2018 | Motwani | G06F 11/1012 |
| 10,291,258 | B2* | 5/2019 | Chen | H03M 13/616 |
| 10,572,343 | B2 | 2/2020 | Halbert et al. | |
| 2008/0104476 | A1* | 5/2008 | Holman | G06F 11/1028 |
| | | | | 714/752 |
| 2017/0177246 | A1* | 6/2017 | Miller | G06F 11/1658 |

OTHER PUBLICATIONS

Starting on p. 1, figures 1, 2, 3, and 4a only of the non-published U.S. Appl. No. 16/905,384, filed Jun. 18, 2020, pp. 1-4.
Starting on p. 4, paragraphs [0016] through paragraph [0032] only of the non-published U.S. Appl. No. 16/905,384, filed Jun. 18, 2020, pp. 4-10.

* cited by examiner

*Primary Examiner* — Cynthia Britt
*Assistant Examiner* — Sazzad Hossain
(74) *Attorney, Agent, or Firm* — Compass IP Law PC

(57) ABSTRACT

An apparatus is described. The apparatus includes a memory chip. The memory chip has an error correction code (ECC) encoder logic circuit and an ECC decoder logic circuit. The ECC decoder logic circuit is to place an additional one or more errors that result from incorrect error correction applied to a read code word into a same block of multiple blocks of the read code word's raw data bit portion where original errors in the read code word existed before the read code word was decoded by the ECC decoder logic circuit.

20 Claims, 10 Drawing Sheets

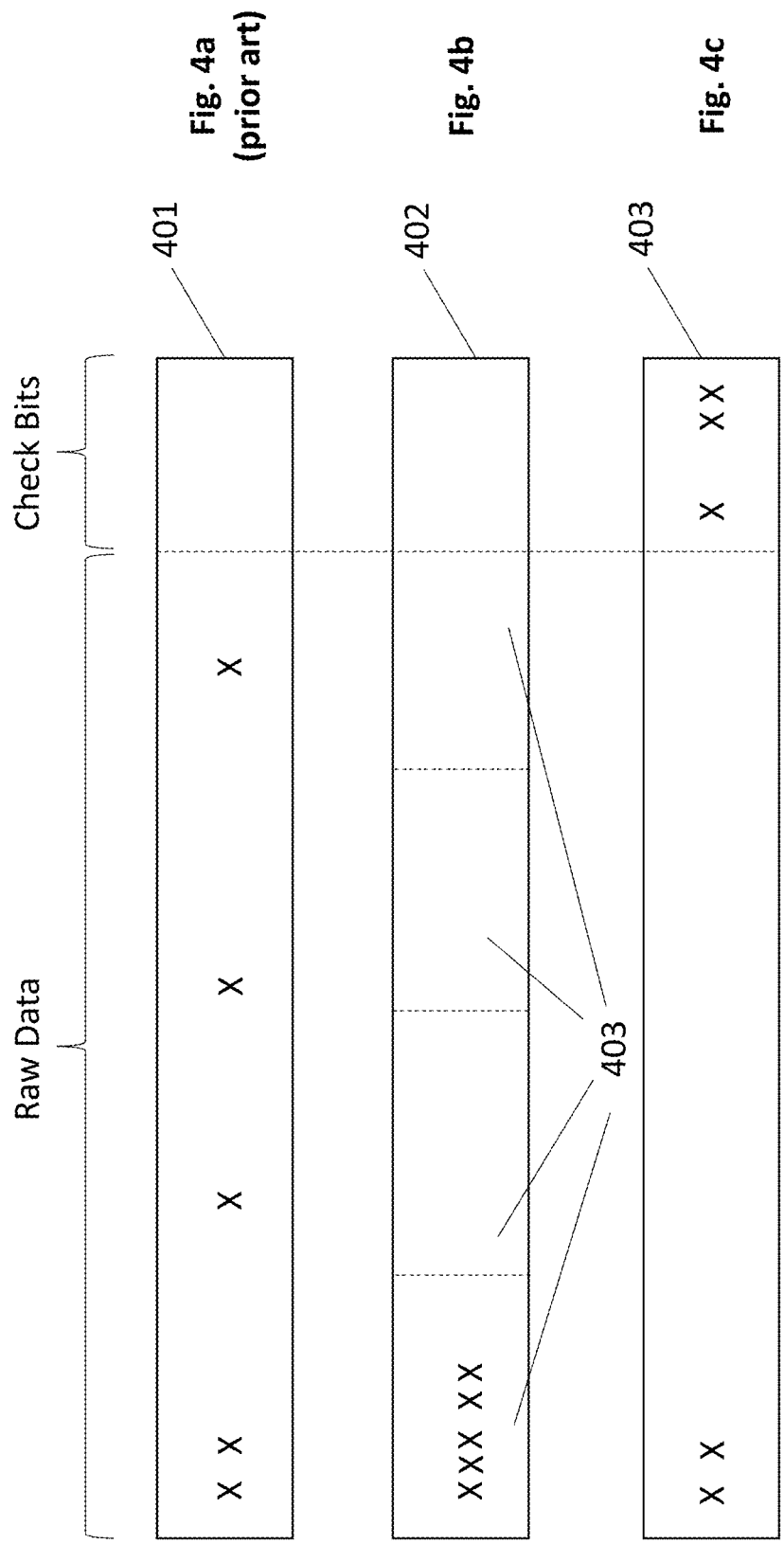

ECC MEMORY CHIP ENCODER AND DECODER

FIELD OF INVENTION

The field of invention pertains to an improved ECC memory chip encoder and decoder.

BACKGROUND

As memory chip minimum feature sizes continue to shrink, the propensity of memory chips to exhibit various forms of errors is increasing. As such, memory chip and/or memory system designers are seeking additional options for error correction code (ECC) algorithm implementations to better protect the information stored in memory against such errors.

FIGURES

A better understanding of the present invention can be obtained from the following detailed description in conjunction with the following drawings, in which:

FIG. 4a shows faulty error correction of a traditional on memory chip ECC algorithm;

Figure 5A:
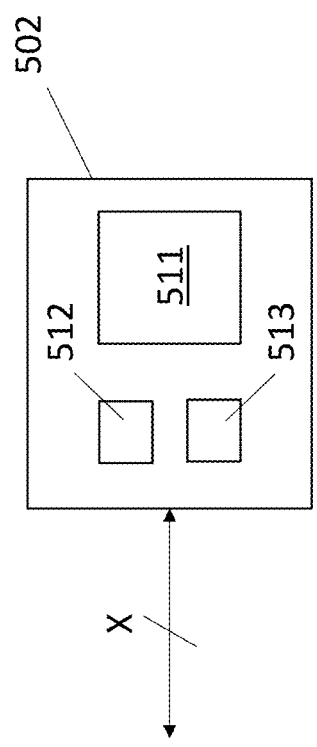
Figure 5B:
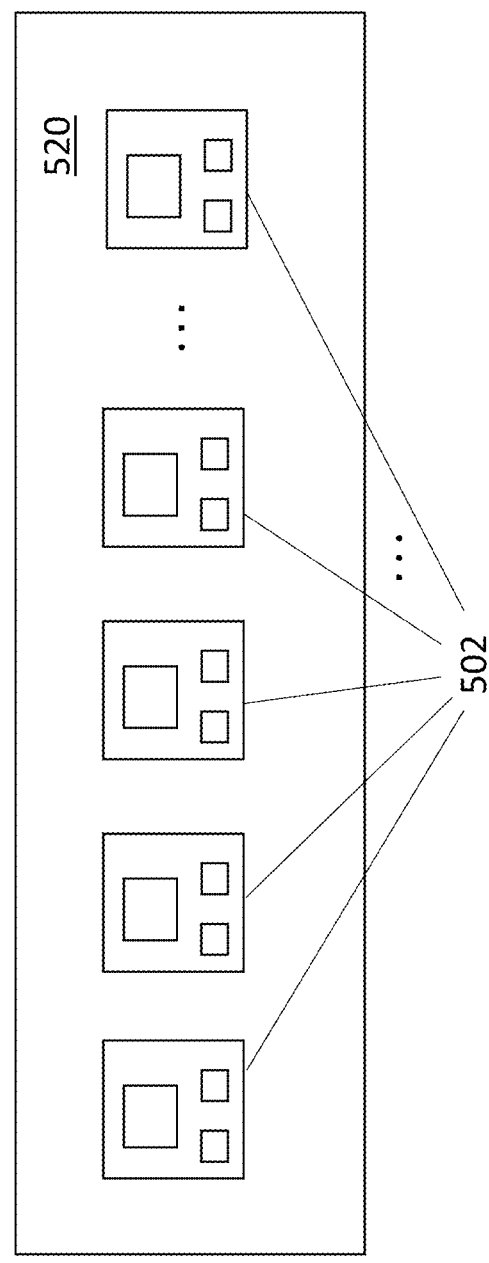
Figure 10:
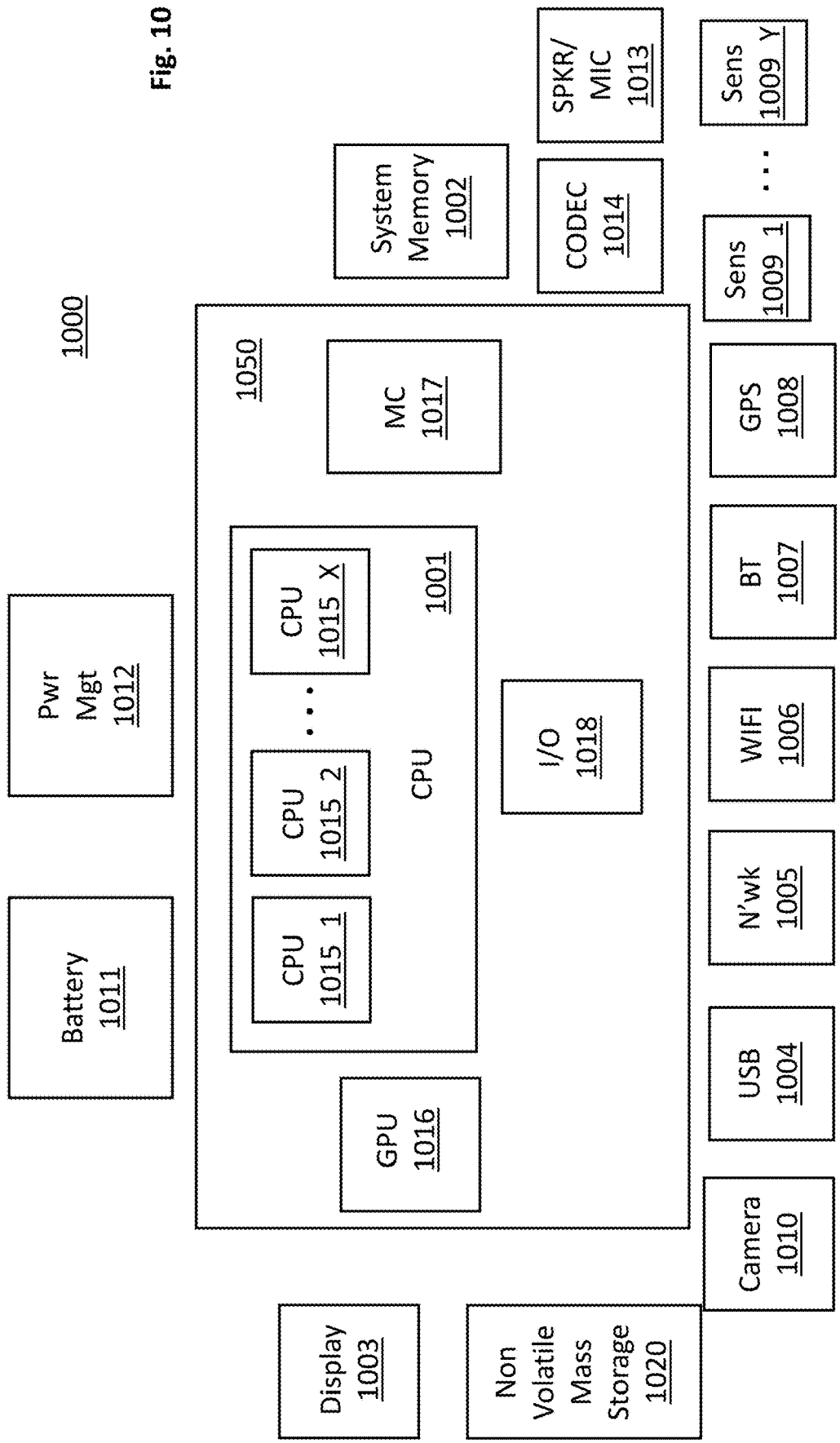

FIGS. 4b and 4c pertain to faulty error correction for an improved memory chip ECC algorithm;

FIG. 5a shows an improved memory chip;

FIG. 5b shows an improved memory module;

FIG. 6 shows a Cayley table;

FIG. 7 shows another Cayley table;

Figure 8:
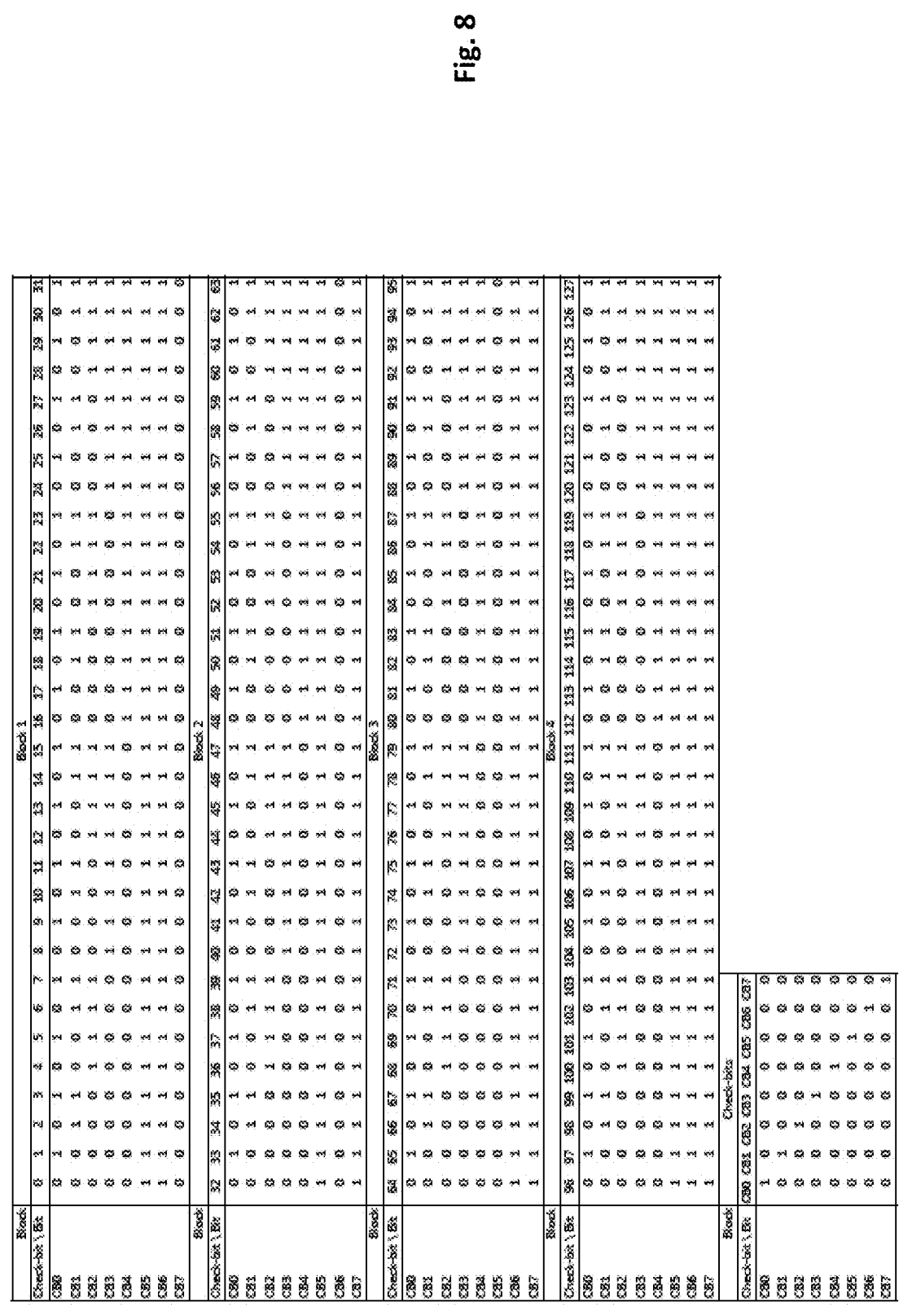

FIG. 8 shows an H matrix for an improved ECC algorithm;

FIG. 9 shows another Cayley table;

FIG. 10 shows a computer system.

DETAILED DESCRIPTION

Figure 1:
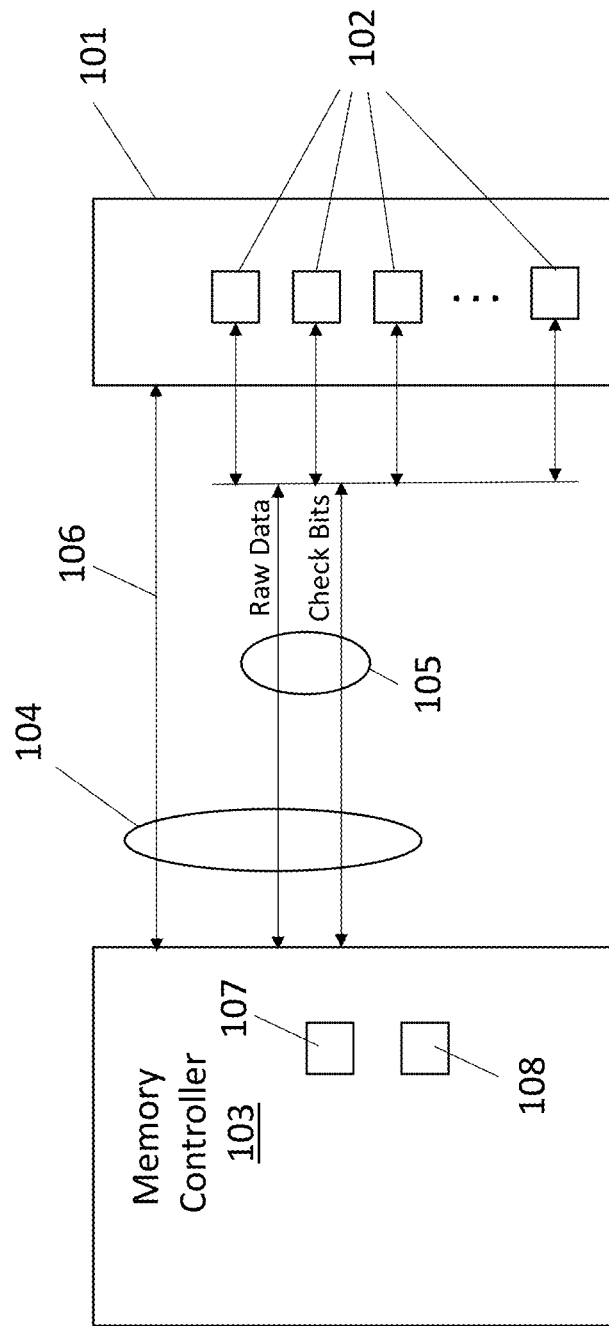
FIG. 1 shows a memory controller coupled to a memory module by way of a memory channel.

FIG. 1 shows a traditional memory system implementation. As observed in FIG. 1, multiple memory chips 102 are disposed on a memory module 101 (such as a dual in-line memory module (DIMM), or stacked memory chip memory module). The memory module 101 is coupled to a memory controller 103 by a data channel 104 that is composed of a data bus 105 and a command and address channel 106.

The data bus 105 has a bit width that corresponds to the number of raw data bits that are simultaneously transmitted on the data bus and their corresponding error correction coding (ECC) bits (also referred to as "check bits"). For example, according to one Joint Electron Device Engineering Council (JEDEC) Dual Data Rate 4 industry standard specification (e.g., JEDEC DDR version 4, "DDR4", initial specification published in September 2012 by JEDEC), the data bus 105 is 72 bits wide where 64 bits are for raw data and eight bits are for ECC. According to another JEDEC industry standard specification (e.g., Dual Data Rate 5 version 5, "DDR5" currently in discussion by JEDEC), the data bus 105 is 40 bits wide where 32 bits is for raw data and eight bits is for ECC. Other potential applicable JEDEC standards include, e.g., DDR3 (Double Data Rate version 3, original release by JEDEC (Joint Electronic Device Engineering Council) on Jun. 27, 2007), LPDDR3 (Low Power DDR version3, JESD209-3B, August 2013 by JEDEC), LPDDR4 (LPDDR version 4, JESD209-4, originally published by JEDEC in August 2014), WIO2 (Wide Input/Output version 2, JESD229-2 originally published by JEDEC in August 2014), HBM (High Bandwidth Memory, JESD325, originally published by JEDEC in October 2013), HBM2 (HBM version 2, currently in discussion by JEDEC), or others or combinations of memory technologies, and technologies based on derivatives or extensions of such specifications. The JEDEC standards are available at www.jedec.org.

The individual memory chips 102 are typically implemented as four bit wide devices ("x4") or eight bit wide devices ("x8"). Thus, the number of memory chips 102 per rank of memory is a function of the width of the data bus 105 and the bit width of the memory chips 102 (a rank is a set of memory chips that can interface with the memory controller 103 over the memory channel 104 as a cohesive unit of memory). For instance, a single JEDEC DDR4 rank of x4 memory chips includes eighteen memory chips (72/4=18), a single JEDEC DDR5 rank of x4 memory chips includes ten memory chips (40/4=10).

The command and address channel 106 (which can also be referred to as the "command bus", "command channel", "command/address (C/A) bus" and the like) transports addresses and commands from the memory controller 103 to the memory module 101 and/or any/all of its corresponding memory chips 102.

Data transfers between a rank of memory chips 102 and the memory controller 103 are often performed as a burst of multiple transfers where, traditionally, the total amount of raw data transferred over the course of the burst is 64 bytes (=512 bits). Thus, in the case of a JEDEC DDR4 memory, a burst is composed of eight transfers over the data bus (64b of raw data per transfer×eight transfers=512 bits of raw data), whereas, in the case of a JEDEC DDR5 memory, a burst is composed of sixteen transfers over the data bus (32b of raw data per transfer×sixteen transfers=512 bits of raw data). Note that, for each transfer of the burst, eight check bits are also transmitted over the data bus 105.

Here, the entire data structure that is transferred over the course of the burst operation is referred to as a "code word". That is, for example, in the case of DDR4, each write or read burst transports a code word having 512 raw data bits and 64 check bits (eight transfers per burst and eight check bits per transfer). By contrast, in the case of DDR5, each burst transports a code word having 512 raw data bits and 128 check bits (sixteen transfers per burst and eight check bits per transfer).

As such, during a write operation, an encoder 107 within the memory controller 103 calculates a check bits value for the 512 bits that are to be written into a rank of memory chips. The check bits value is then written into the memory rank along with the raw data during a burst transfer write operation (i.e., the code word generated by the encoder 107 is written into the memory rank). When the same data is subsequently the target of a read operation, the code word (the 512 bits and corresponding check bits value) is read from the rank over the course of a burst read.

Generally, if there are M raw data bits in a code word, there are $2^M$ different raw data bit pattern possibilities each one of which is assigned a particular check bits value (a check bits value is the specific combination/pattern of check bits in the code word). Moreover, assuming there are N check bits and N<M, a number of code words having different raw data bit patterns will have a same check bits value.

A key perspective of an error correction coding algorithm is that, if there are N+M total bits per codeword, there are $2^{(N+M)}$ different code word bit pattern combinations. However, only a subset of these is deemed valid (because, as described above, a same check bits value is used for multiple code words each having a different raw data bit pattern). That is, the number of valid codewords is less than $2^{(N+M)}$.

When a burst read of previously written data is performed, an ECC decoder 108 within the memory controller processes the received code word to verify that all the raw data is correct, or, hopefully, correct any errors in the raw read data if such errors exist. Mathematically speaking, the processing on the read code word performed by the ECC decoder 108 determines if the read code word is a valid code word. If so, the raw data is deemed to be valid. If, however, there is an error in the raw data or the check bits, the error can be corrected if the total number of errors is beneath some threshold.

Figure 2:
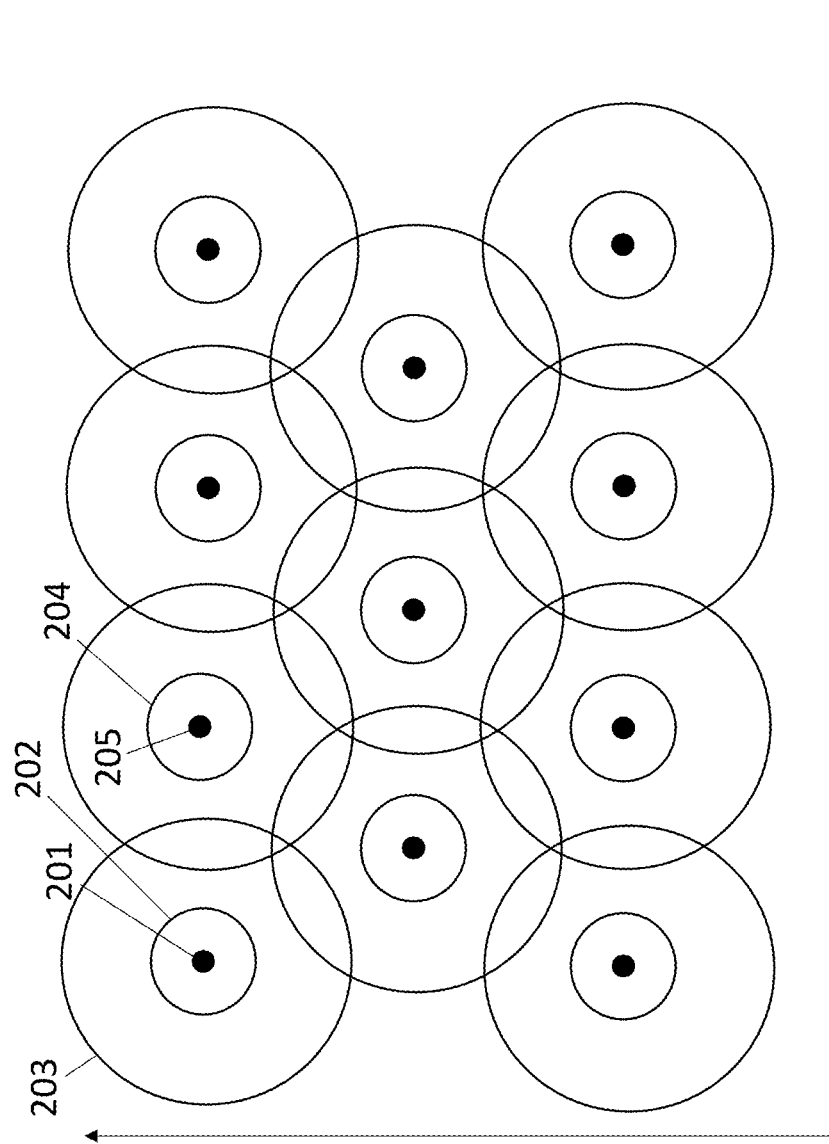
FIG. 2 shows code words and corresponding radii or error correction and error detection in two dimensional space.

FIG. 2 graphically depicts the operation of the decoder. Here, the $2^{(M+N)}$ different possible bit pattern combinations are presumed to be evenly spread out over two dimensional space (e.g., a left half of the M+N bits establish a Y axis component and a right half of the M+N bits establish an X axis component). Each valid code word corresponds to a point 201 in the two dimensional space (for ease of drawing FIG. 2 only labels one of the points and depicts only a subset of the total set of points). Space between the points contain invalid code words. First and second circles 202, 203 having first and second radii are centered about each point (code word) in the two dimensional space (the second circle 203 has a radius that is larger than the first circle 202).

Here, referring now to FIGS. 1 and 2, if the code word of a burst read operation received by the memory controller 103 is invalid but its specific bit pattern places it inside the first circle 202 of the correct code word 201 (i.e., the received code word falls within the first circle 202 about a point 201 that represents the correct code word), the decoder 108 will conclude that the received (invalid) code word is supposed to be the code word associated with the point 201 in the first circle 202 and will present (output) the raw data bit pattern of the later as the burst read data. Here, the area of the first circle 202 other than the point 201 corresponds to a number of invalid code words each having a small number of bits that are different than the specific bit pattern of the valid code word 201. For example, if the ECC algorithm allows for correction of a code word that differs by two bits from its valid code word, the radius of the circle corresponds to two bits.

If the received code word is invalid and its specific bit pattern places it outside the radius of the first circle 202 but inside the radius of the second circle 203, the decoder 108 will recognize that there is an error but will not be able to correct it. In this case, the decoder 108 will signal an error flag.

Figure 3:
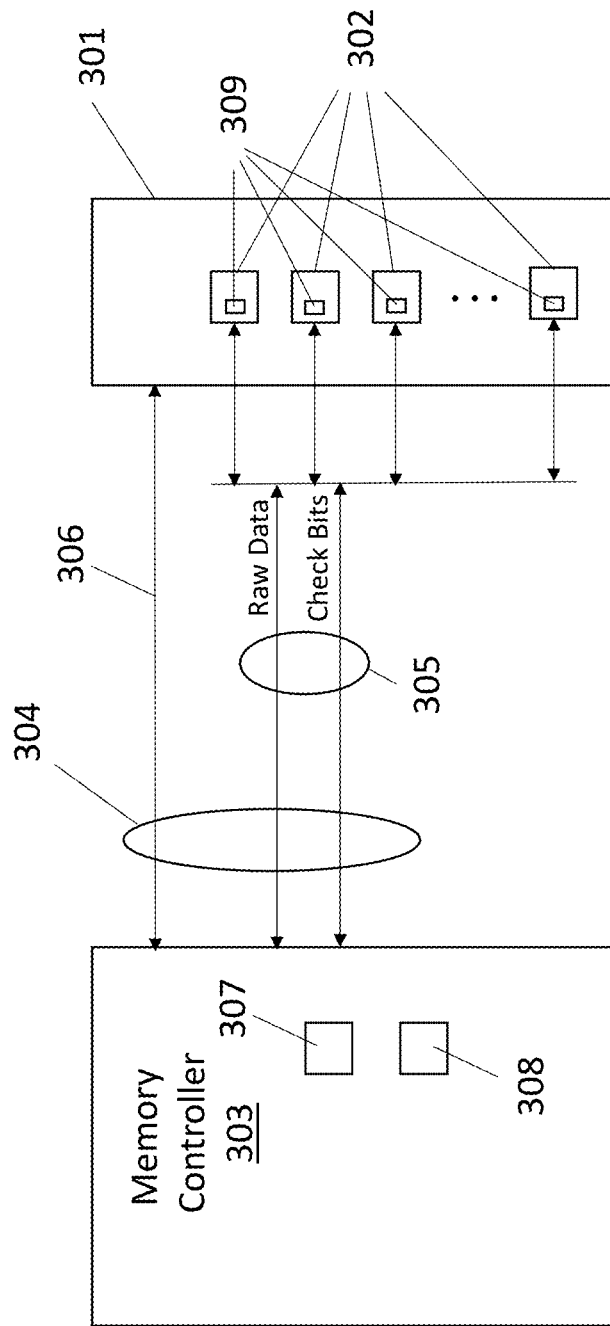
FIG. 3 shows a memory controller coupled to a memory module by way of a memory channel where the memory chips of the memory module have ECC encoder and decoder logic circuitry.

With the continuously decreasing minimum feature sizes of memory chip manufacturing processes, the memory chips themselves are becoming less and less reliable. That is, memory chips are beginning to exhibit higher inherent bit error rates. As such, as observed in FIG. 3, the memory chips 302 themselves are being designed with ECC encoder and decoder logic circuitry 309 so that each of the memory chips 301 can internally calculate a code word for the specific bits they receive and store during a burst write sequence. Likewise, during a subsequent burst read of the same data, each of the memory chips 301 can internally correct and/or detect errors in the read code word that is retrieved from their internal storage cells.

Here, each memory chip's internal ECC encoder logic circuitry calculates a check bits value from the raw data it receives during the burst write, forms a code word from the raw data and check bits value, and stores the code word in the memory's chip storage cells. Likewise, upon a subsequent burst read of the same data, the memory chip's internal ECC decoder logic circuitry can correct or detect errors in the same data according to the same mathematical principles discussed above with respect to FIG. 2.

For example, in the case of an x8 memory chip that is used to store raw data in its particular rank for a DDR5 implementation, the memory chip will receive 128 bits over the course of a burst write sequence (sixteen transfers per burst write×eight bits per transfer=128 bits). The memory chip's internal ECC decoder logic circuitry will calculate a check bits value over the 128 bits, append the check bits value to the raw data to form a code word, and store the code word in the memory chip's internal storage cells. If the raw data is subsequently the target of a burst read, the memory chip's internal ECC decoder logic circuitry will read the code word and determine if the read code word corresponds to a valid code word. If so, the raw data is presented on the memory channel as the read data for the read burst.

If the read code word does not correspond to a valid code word, the ECC decoder logic circuitry will correct the code word if the error in the code word is within the error correction threshold of the ECC algorithm (as described above with respect to FIG. 2). The ECC encoding algorithms for present-day memory chips have an error correction threshold of one bit (the memory chip's ECC decoder will correct a code word that differs by one bit from the correct code word). If the error in the code word exceeds the error correction threshold but falls within the error detection threshold, the memory chip's ECC decoder will send the uncorrected data to the memory controller.

Note that if a memory chip can detect but not correct an error in its read code word, depending on the circumstances, the memory controller's ECC decoder 308 may still be able to correct the errors. Here, the memory controller's ECC algorithm, being calculated over an entire cache line and having more check bits per code word, is more robust than any individual memory chip's ECC algorithm (which is calculated only over the memory chip's portion of the code word generated by the memory controller and has fewer check bits).

Thus, even if a memory chip cannot correct some number of errors in its burst read data, if the total number of errors in the memory controller's received code word is within the error correction threshold of the memory controller's ECC algorithm, the memory controller 303 can still correct the errors that the memory chip was not able to correct.

A problem can exist, however, when a memory chip internally detects the existence of errors during a burst read sequence and attempts to correct them but instead introduces even more errors than were present in the code word that was originally read from the memory cell's internal storage cells. Referring back to FIG. 2, such an error is possible if the number of errors in the received code word is large enough to bring it within the circle of a code word that is different than the code word that the read code word was actually generated from. For instance, if the correct code word corresponds to point 201 but the corruptions in the read code word places the read code word in circle 204. In this case the memory chip will present the read burst data as the raw data for the code word that corresponds to point 205 and not point 201.

Thus, under this particular scenario, the memory chip's ECC decoder logic circuitry can add more errors to the memory controller's code word than it would have otherwise contained if the memory chip has not attempted to correct its corrupted code word. This scenario can be particularly problematic if the additional errors inserted into the memory controller's code word causes the memory controller's code word to exceed the memory controller's ECC error correction threshold. In this case, the additional errors introduced by the memory chip's faulty error correction results in the memory controller being unable to correct/recover the cache line being read from memory.

A solution to this particular problem is to carefully construct the ECC algorithm used by the memory chip so that, if it were to introduce additional errors to a read code word, the errors would be introduced: 1) near the originally incorrect bits if the originally incorrect bits are within the raw data portion of the code word (originally incorrect bits are bits that are incorrect as read from the memory chip's storage cells prior to decoding by the memory chip's ECC decoder logic circuitry); or, 2) within the check bits value of the improperly corrected code word.

In the case of the former, even though more errors are introduced, the memory controller's ECC algorithm has a better chance of correcting the errors (generally, keeping the memory chip's incorrect raw data bits closer together tends to keep the memory controller's code word within the error correction threshold of the memory controller's ECC algorithm). In the case of the later, there are no additional errors introduced into the raw data (the memory chip only presents the raw data portion of its internally generated code word on the memory channel (it strips off the check bits value of its internally generated code word)).

FIGS. 4a and 4b provide more insight into both the problem and the solution. FIG. 4a pertains to an implementation that uses a traditional memory chip ECC algorithm which does not constrain the location of additional errors as described just above. Here, FIG. 4a shows the memory chip's internal code word 401 after faulty error correction that introduces errors into the code word in addition to the original errors. For the sake of example one can assume there were three original errors and the faulty error correction added two more errors. As observed in FIG. 4a, the bit positions of the errors within the code word 401 are more scattered or randomized.

FIG. 4b pertains to an implementation that uses an improved memory chip ECC algorithm as described above which constrains the location of additional errors as described. As observed in FIG. 4b, the raw data portion of the code word 402 is deemed to be broken down into smaller blocks or regions 403. Notably, all of the errors are confined within one of the blocks. As such, the bit positions of the errors are less scattered or randomized within the code word as compared to the code word 401 of FIG. 4a.

Thus, the improved ECC encoding algorithm of FIG. 4b is structured such that, if the decoding process mistakenly adds more errors to the code word in the raw data portion than existed in the code word prior to its decoding, the additional errors are kept within the same block where the original errors were located. As discussed above, constraining the additional errors into the same block as the original errors gives the memory controller's ECC algorithm a better chance of correcting the errors in the overall raw data. Moreover, owing to the types of internal memory chip failures that result in multiple errors in a single pre decode read code word (e.g., sub word line arm, driver faults, etc.), if multiple errors are to exist, there is a respectable likelihood that all the errors will exist in a same block of the code word.

FIG. 4c pertains to an extension of the improved memory chip ECC algorithm of FIG. 4b, where, an incorrectly corrected code word that adds more errors to the code word than existed prior to decoding can, alternative to the result of FIG. 4b, instead introduce the additional errors in the check bits portion of the code word. In this case the original errors can be in the raw data portion or the check bits portion. Here, the additional errors are not even presented to the memory controller because the memory chip strips off the check portion and only sends the raw data portion of the code word to the memory controller during a burst read sequence.

Further below an approach is described for structuring an ECC algorithm to have the properties described above with respect to FIGS. 4b and 4c. As described therein, a Cayley table is used to help guide selection of the valid code words.

Both single error correction (SEC) and single error correction double error detection (SEC-DED) algorithms are described further below. As is known in the art, an SEC algorithm can correct a one bit error in a code word, whereas, an SEC-DED algorithm can correct a single error and detect up to two errors. Thus, referring back to FIG. 2, an SEC algorithm does not have a second circle about each point, whereas, an SEC-DED algorithm does have two circles about each point.

Specifically, for an SEC-DED algorithm, the first circle about each point in FIG. 2 corresponds to the set of single bit errors and the second circle about each point in FIG. 2 corresponds to the set of two bit errors. Thus, faulty error corrections can occur when there are three or more errors in the original, pre-decode read code word. In a particular embodiment described further below, faulty error corrections for the SEC-DED algorithm can place the additional errors only in the same block of the code word where the original errors reside.

In the case of an SEC code, faulty error corrections can occur when there are two or more errors in the original, pre-decode read code word. In a particular embodiment described further below, faulty error corrections for the SEC algorithm place the additional errors in the same block where the original errors reside or the check bits region of the code word.

For either SEC or SEC-DED codes, as described further below, block sizes of sixteen bits and 32 bits are described for a code word having a 128 bit raw data bit portion (which corresponds to 6.25% and 12.5% respectively of the size of the group formed by all possible H-matrix columns of length N and the zero column of length N with the bit-wise exclusive OR (XOR) operation, where, N is the number of check-bits). That is the group of all binary columns of length N with the bit-wise XOR operation.

FIG. 5a shows a memory chip 502 that has been designed to include an ECC encoder logic circuit 512 and ECC decoder logic circuit 513 whose corresponding ECC algorithm has any of the above described improved ECC algorithm characteristics. In various embodiments the memory chip 502 is an X4 or X8 memory chip having an interface that is compatible with a JEDEC DDR standard specification.

FIG. 5b shows a memory module 520 having multiple ones of the memory chip 502 described just above with respect to FIG. 5a. The memory module 520 can be a dual in-line memory module (DIMM), a stacked memory chip memory module (e.g., JEDEC High Bandwidth Memory (HBM)) or some other memory module. Here, the memory module 520 can have enough chips to plug one or more ranks of memory into an industry standard memory channel specification (such as a JEDEC DDR memory channel specification).

Additional details concerning the development of an ECC code having properties as described above is provided immediately below. Consider the single error correction case, the set of all possible columns of the parity check matrix or H-matrix and the all zero column form a group with modulo 2 component-wise addition (also known as bit-wise XOR). This is the group of all binary columns of length N with modulo 2 component-wise addition. Where, N, is the number of check-bits. That is the group formed by all binary columns of length N with modulo 2 component-wise addition. The interaction between two members of a finite group under the group operation can be described using a Cayley table. The Cayley table describes the structure of a group (e.g., a Cayley table describes the structure of a finite group by arranging all the possible products of all the group's elements in a square table).

In this case it can be used to steer mis-corrections (additional errors introduced to the code word by faulty error correction) into desired locations.

Consider the case where N=8, then the Cayley table of the group made up of all possible H-matrix columns and the all zero column of length N with the bit-wise XOR operation would be as observed in FIG. 6 (FIG. 6 depicts a compressed Cayley table of the possible H-matrix columns group under bit-wise XOR, N=8). The columns are represented in decimal form for readability.

Each square represents all possible results of a bit-wise XOR operation between a member in the corresponding outer most column set and outer most row set. For the H-matrix to form a valid single error correction (SEC) code two conditions must be met: 1) all columns in the H-matrix must be unique and non-zero; and, 2) the check-bit portion of the H-matrix must form a basis for the group, in other words the check-bit portion of the H-matrix must be an invertible binary N×N matrix.

Figure 7:
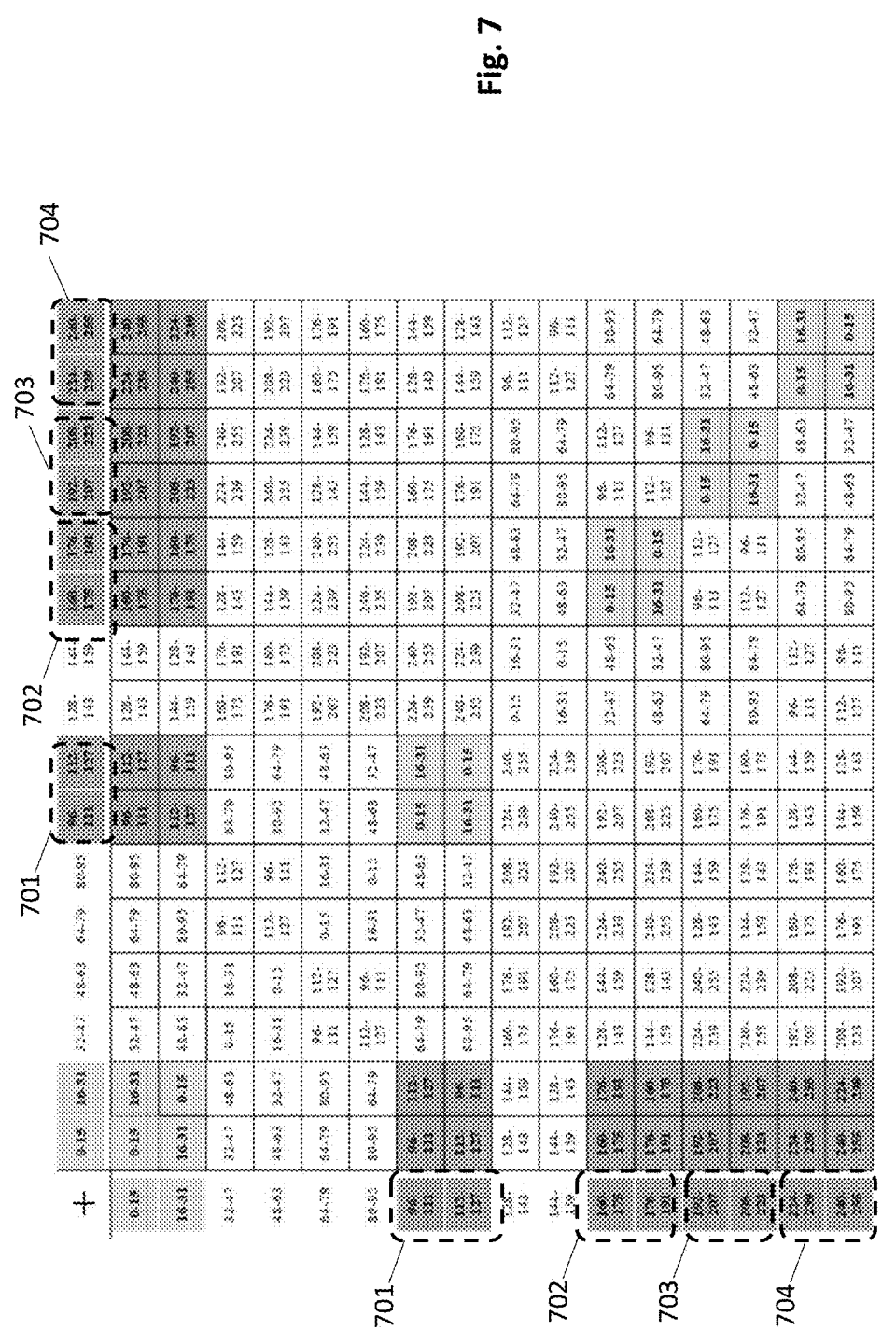

FIG. 7 depicts a Cayley table for an 136 bit code word composed of 128 bits of raw data and eight check bits, where, the 128 bits of raw data are viewed as being broken down into four blocks of 32 bits each. FIG. 7 shows the structure of a 32b block failure boundary code and describes all possible results from errors that are confined to a single data block. The data blocks will be covered by the blocks in regions 701, 702, 703, 704 (regions of a same reference number correspond to a same block), the check-bits region of the H-matrix will be the identity matrix. Using the identity matrix for the check-bit portion of the matrix creates a standard or systematic code and ensures that the check-bit portion of the H-matrix is invertible.

When choosing which blocks were to be used to cover the data bit portions of the H-matrix, those that contained columns with weight 1, such as 32-63 or 128-159, were eliminated, because the weight 1 columns would be used for check-bits. This leaves less than 32 vectors for the data in such blocks. This leaves the blocks regions 701, 702, 703, 704 (that is [96,127], [160,191], [192,223], and [224,255]), respectively.

The Cayley table of FIG. 7 shows that any bit-wise XOR between two members of one of the data blocks will result in a column in the block [0,31]. Furthermore, it shows that the bitwise XOR between a column in [0,31] and column in a data block will result in a vector in the data block. Since the error syndrome for a systematic code will simply be the bitwise XOR of the columns in the H-matrix that correspond to bits that have been flipped, and since columns from [0,31] only appear in the H-matrix in the check-bit region, any multi-bit errors confined to a 32b block will mis-correct into the failed block or into the check-bit region. In the case that codes of this class are used for on-die ECC memory, the host memory controller never sees the on-die ECC check-bits, so the block failure boundary is preserved.

FIG. 8 shows an example of an H-matrix for a 136 bit code word composed of 128 bits of raw data and eight check bits, where, the 128 bits of raw data are viewed as being broken down into 4 blocks of 32 bits each.

Figure 9:
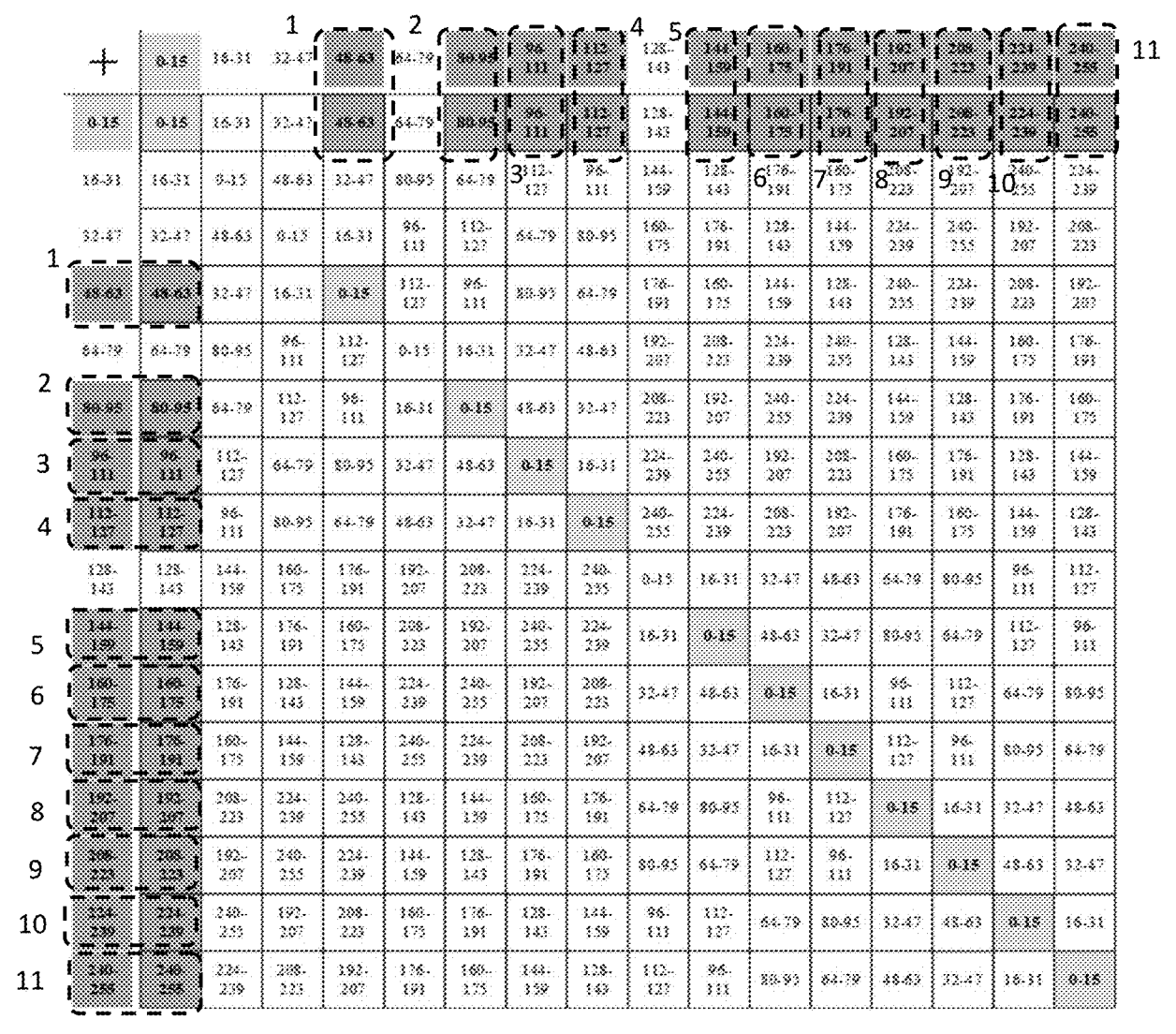

FIG. 9 shows a Cayley table for a 136 bit code word composed of 128 bits of raw data and eight check bits, where, the 128 bits of raw data are viewed as being broken down into eight blocks of sixteen bits each (a 16b block failure boundary code with N=8). Note that in this case there are more blocks available for data, since the blocks have higher granularity than in the 32b block case with N=8. This example corresponds to a single error correction (SEC) code that uses a code word in which all the raw data bits are divided into equally sized blocks of 6.25% of the size of the group formed by all possible H-matrix columns and the zero column with bit-wise XOR and the maximum number of raw data bits in a block will be a power of 2.

In this case a total of 176 data bits, divided into 16b blocks may be covered by the code.

Similar codes can also be constructed for even higher granularity blocks for the same subject code word (128 bits raw data and eight check bits), as long as those blocks are a power of 2. For N=8, a code may also be constructed for 64b blocks (although this code loses all usefulness since there is only 1 block available for data).

In general, the maximum number of raw data bits available for a block of size, b, where b is a power of 2 is:

$$\text{max data bits} = b * \left( \frac{2^N}{b} + \log_2(b) - 1 - N \right)$$

where the data bits are to be divided up into each data block. The maximum block size is given by:

$$b = \frac{2^N}{4}$$

But this is the degenerate case of a single block. The maximum block size for a code that will yield multiple blocks is given by:

$$b = \frac{2^N}{8}$$

where, b is the block size, and N is the number of check bits for an SEC code.

Thus, a family of single error correction (SEC) codes have been described that use a code word in which all the raw data bits are divided into equally sized blocks of the total number of raw data bits and the maximum number of raw data bits in a block will be a power of 2. The number of bits in a block may be, in various embodiments, 6.25%, 12.5%, or some other percentage of the form $$\frac{2^k}{2^N}.$$

100%≤12.5%, where k is a positive integer, note that k must be greater than zero. If a collection of errors is confined to one block than any mis-correction by the SEC code will be contained within that block or the check bit portion of the code word.

A single error correction-double error detection (SEC-DED) may also be constructed using a SEC code of this class as a base and adding an additional check bit. With that check-bit, one can ensure that all the columns in the H-matrix have odd weight, that is an odd number of 1's. Then, the bit-wise XOR of an even number of columns would be even, and therefore not cause mis-correction. It should also be clear from the Cayley table and discussion above that the base SEC code will ensure that failures confined to a data block will only mis-correct to the data block and not to the check-bit region. That is, in various embodiments of an SEC-DED code, when a collection of original errors is confined to one block, then any mis-correction will also be contained within that block (and not to the check bits).

FIG. 10 provides an exemplary depiction of a computing system 1000 (e.g., a smartphone, a tablet computer, a laptop computer, a desktop computer, a server computer, etc.). As observed in FIG. 10, the basic computing system 1000 may include a central processing unit 1001 (which may include, e.g., a plurality of general purpose processing cores 1015_1 through 1015_X) and a main memory controller 1017 disposed on a multi-core processor or applications processor, a main memory 1002 (also referred to as system memory), a display 1003 (e.g., touchscreen, flat-panel), a local wired point-to-point link (e.g., Universal Serial Bus (USB)) interface 1004, various network I/O functions 1005 (such as an Ethernet interface and/or cellular modem subsystem), a wireless local area network (e.g., WiFi) interface 1006, a wireless point-to-point link (e.g., Bluetooth) interface 1007 and a Global Positioning System (GPS) interface 1008, various sensors 1009_1 through 1009_Y, one or more cameras 1010, a battery 1011, a power management control unit 1012, a speaker and microphone 1013 and an audio coder/decoder 1014. The power management control unit 1012 generally controls the power consumption of the system 1000.

An applications processor or multi-core processor 1050 may include one or more general purpose processing cores 1015 within its CPU 1001, one or more graphics processing units 1016, a main memory controller 1017 and an I/O control function 1018 (e.g., peripheral control hub). The general purpose processing cores 1015 typically execute the operating system and application software of the computing system. The graphics processing unit 1016 typically executes graphics intensive functions to, e.g., generate graphics information that is presented on the display 1003.

The main memory controller 1017 interfaces with the main memory 1002 to write/read data to/from main memory 1002. The graphics processing unit 1016 can also be coupled to its own local memory (not shown in FIG. 10 for convenience). Also, additional functional blocks that perform numerically intensive computations (e.g., one or more accelerators such as machine learning and/or artificial intelligence accelerators) can be integrated into the system 1000 and have their own local memory (also not shown in FIG. 10).

Any of these memories can be composed of memory chips as described above having internal ECC encoder and decoder logic circuits where the underlying ECC algorithm, when introducing additional errors to a read code word through faulty error correction, will place the errors: 1) in a block of the raw data bit portion of the pre-decoded read code word where the original errors were located; and/or 2) the check bits portion of the code word.

Each of the touchscreen display 1003, the communication interfaces 1004-1007, the GPS interface 1008, the sensors 1009, the camera(s) 1010, and the speaker/microphone codec 1013, 1014 all can be viewed as various forms of I/O (input and/or output) relative to the overall computing system including, where appropriate, an integrated peripheral device as well (e.g., the one or more cameras 1010). Depending on implementation, various ones of these I/O components may be integrated on the applications processor/multi-core processor 1050 or may be located off the die or outside the package of the applications processor/multi-core processor 1050. The computing system also includes non-volatile storage 1020 which may be the mass storage component of the system.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., field programmable gate array (FPGA), programmable logic device (PLD)) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, compact disk (CD)-read only memories (ROMs), and magneto-optical disks, flash memory, programmable read only memories (PROM)s, electrically erasable programmable read only memories (EEPROMs), magnetic or optical cards, or other type of media/machine-readable medium suitable for storing electronic instructions. The present invention may be downloaded as a computer program which may be transferred from a remote computer (e.g., a server) to a requesting computer (e.g., a client).

An apparatus is described. The apparatus includes a memory chip. The memory chip has an error correction code (ECC) encoder logic circuit and an ECC decoder logic circuit. The ECC decoder logic circuit is to place an additional one or more errors that result from incorrect error correction applied to a read code word into a same block of multiple blocks of a raw data bit portion of the read code word where original errors in the read code word existed before the read code word was decoded by the ECC decoder logic circuit.

In various embodiments the ECC code effected by the ECC encoder logic circuit and the ECC decoder logic circuit is a single error correction code. In various embodiments the ECC decoder logic circuit is also to place a second additional one or more errors that result from incorrect error correction applied to a second read code word into a check bits portion of the read code word.

In various embodiments the ECC decoder logic circuit is also to place a second additional one or more errors that result from incorrect error correction applied to a second read code word into a check bits portion of the read code word. In various embodiments the ECC code effected by the ECC encoder logic circuit and the ECC decoder logic circuit is a single error correction double error detection code.

In various embodiments the multiple blocks each correspond to no more than 12.5% of the size of a group formed by all binary columns of length N, where N is a number of check bits in the read code word, and a bit-wise XOR operation. In various embodiments, the multiple blocks each correspond to no more than 6.25% of the size of the group. In various embodiments, the raw data bit portion of read code word is 128 bits and a check bit portion of the read code word is eight bits.

Another apparatus has been described. The apparatus includes a memory module. The memory module includes multiple memory chips. Each of the memory chips include the following: an error correction code (ECC) encoder logic circuit and an ECC decoder logic circuit, the ECC decoder logic circuit is to place an additional one or more errors that result from incorrect error correction applied to a read code word into a same block of multiple blocks of the read code word's raw data bit portion where original errors in the read code word existed before the read code word was decoded by the ECC decoder logic circuit.

A computing system has been described. The computing system includes: a plurality of processing cores; a main memory controller coupled to a main memory; and an accelerator and/or graphics processing unit coupled to local memory. At least one of the main memory and local memory comprise a memory chip. The memory chip has an error correction code (ECC) encoder logic circuit and an ECC decoder logic circuit. The ECC decoder logic circuit is to place an additional one or more errors that result from incorrect error correction applied to a read code word into a same block of multiple blocks of the read code word's raw data bit portion where original errors in the read code word existed before the read code word was decoded by the ECC decoder logic circuit.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a memory chip, the memory chip comprising an error correction code (ECC) encoder logic circuit and an ECC decoder logic circuit, the ECC decoder logic circuit to place an additional one or more errors that result from incorrect error correction applied to a read code word into a same block of multiple blocks of a raw data bit portion of the read code word where original errors in the read code word existed before the read code word was decoded by the ECC decoder logic circuit.

2. The apparatus of claim 1 wherein an ECC code effected by the ECC encoder logic circuit and the ECC decoder logic circuit is a single error correction code.

3. The apparatus of claim 2 wherein the ECC decoder logic circuit is also to place a second additional one or more errors that result from incorrect error correction applied to a second read code word into a check bits portion of the read code word.

4. The apparatus of claim 1 wherein the ECC decoder logic circuit is also to place a second additional one or more errors that result from incorrect error correction applied to a second read code word into a check bits portion of the read code word.

5. The apparatus of claim 1 wherein an ECC code effected by the ECC encoder logic circuit and the ECC decoder logic circuit is a single error correction double error detection code.

6. The apparatus of claim 1 wherein the multiple blocks each correspond to no more than 12.5% of a size of a group formed by all binary columns of length N, where N is a number of check bits in the read code word, and a bit-wise XOR operation.

7. The apparatus of claim 6 wherein the multiple blocks each correspond to no more than 6.25% of the size of the group.

8. The apparatus of claim 1 wherein the raw data bit portion of the read code word is 128 bits and a check bits portion of the read code word is eight bits.

9. An apparatus, comprising:
a memory module, the memory module comprising multiple memory chips, each of the memory chips comprising the following:
an error correction code (ECC) encoder logic circuit and an ECC decoder logic circuit, the ECC decoder logic circuit to place an additional one or more errors that result from incorrect error correction applied to a read code word into a same block of multiple blocks of a raw data bit portion of the read code word where original errors in the read code word existed before the read code word was decoded by the ECC decoder logic circuit.

10. The apparatus of claim 9 wherein an ECC code effected by the ECC encoder logic circuit and the ECC decoder logic circuit is a single error correction code.

11. The apparatus of claim 10 wherein the ECC decoder logic circuit is also to place a second additional one or more errors that result from incorrect error correction applied to a second read code word into a check bits portion of the read code word.

12. The apparatus of claim 9 wherein the ECC decoder logic circuit is also to place a second additional one or more errors that result from incorrect error correction applied to a second read code word into a check bits portion of the read code word.

13. The apparatus of claim 9 wherein an ECC code effected by the ECC encoder logic circuit and the ECC decoder logic circuit is a single error correction double error detection code.

14. The apparatus of claim 9 wherein the multiple blocks each correspond to no more than 12.5% of a size of a group formed by all binary columns of length N, where N is a number of check bits in the read code word, and a bit-wise XOR operation.

15. The apparatus of claim 14 wherein the multiple blocks each correspond to no more than 6.25% of the size of the group.

16. A computing system, comprising:
a plurality of processing cores;
a main memory controller coupled to a main memory; and,
an accelerator and/or graphics processing unit coupled to a local memory, wherein at least one of the main memory and local memory comprise a memory chip, the memory chip comprising an error correction code (ECC) encoder logic circuit and an ECC decoder logic circuit, the ECC decoder logic circuit to place an additional one or more errors that result from incorrect error correction applied to a read code word into a same block of multiple blocks of a raw data bit portion of the read code word where original errors in the read code word existed before the read code word was decoded by the ECC decoder logic circuit.

17. The computing system of claim 16 wherein an ECC code effected by the ECC encoder logic circuit and the ECC decoder logic circuit is a single error correction code.

18. The computing system of claim 17 wherein the ECC decoder logic circuit is also to place a second additional one or more errors that result from incorrect error correction applied to a second read code word into a check bits portion of the read code word.

19. The computing system of claim 16 wherein the ECC decoder logic circuit is also to place a second additional one or more errors that result from incorrect error correction applied to a second read code word into a check bits portion of the read code word.

20. The computing system of claim 16 wherein an ECC code effected by the ECC encoder logic circuit and the ECC decoder logic circuit is a single error correction double error detection code.

* * * * *